US011688755B2

(12) United States Patent
Kobayashi

(10) Patent No.: US 11,688,755 B2
(45) Date of Patent: Jun. 27, 2023

(54) PHOTOELECTRIC CONVERSION DEVICE, SUBSTRATE, AND EQUIPMENT COMPRISING A CIRCUIT TO DETERMINE AN INTERNAL TEMPERATURE OF THE PHOTOELECTRIC CONVERSION DEVICE BASED ON A CURRENT FOLLOWING IN A RESISTIVE ELEMENT

(71) Applicant: CANON KABUSHIKI KAISHA, Tokyo (JP)

(72) Inventor: Hideo Kobayashi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/693,521

(22) Filed: Mar. 14, 2022

(65) Prior Publication Data

US 2022/0302199 A1 Sep. 22, 2022

(30) Foreign Application Priority Data

Mar. 18, 2021 (JP) ................................. 2021-045157

(51) Int. Cl.
*H01L 27/146* (2006.01)
*H03M 1/12* (2006.01)
(Continued)

(52) U.S. Cl.
CPC .. *H01L 27/14643* (2013.01); *H01L 27/14609* (2013.01); *H03M 1/12* (2013.01); *H04N 25/60* (2023.01); *H04N 25/75* (2023.01)

(58) Field of Classification Search
CPC ........ H01L 27/14643; H01L 27/14609; H03M 1/12; H03M 1/123; H03M 1/742;
(Continued)

(56) References Cited

U.S. PATENT DOCUMENTS 7,990,440 B2 8/2011 Kobayashi et al.
8,710,558 B2 4/2014 Inoue et al.
(Continued)

FOREIGN PATENT DOCUMENTS

JP 2000-224472 A 8/2000
JP 2007-318502 A 12/2007
(Continued)

OTHER PUBLICATIONS

U.S. Appl. No. 17/588,484, filed Jan. 31, 2022 (First Named Inventor: Hideo Kobayashi).
(Continued)

*Primary Examiner* — Que Tan Le
*Assistant Examiner* — Mai Thi Ngoc Tran
(74) *Attorney, Agent, or Firm* — Venable LLP

(57) ABSTRACT

A photoelectric conversion device includes a light receiving circuit configured to convert light into an electrical signal, a first hold circuit configured to hold a data signal which represents the electrical signal, a second hold circuit configured to hold a noise signal read out from the light receiving circuit in a reset state, a first resistive element to which a voltage corresponding to a difference between the data signal held by the first hold circuit and the noise signal held by the second hold circuit is applied, an A/D converter configured to convert an analog current flowing in the first resistive element into digital data, a second resistive element, and a temperature detection circuit configured to generate, based on a current flowing in the second resistive element, an analog output corresponding to an internal temperature of the photoelectric conversion device.

16 Claims, 10 Drawing Sheets

(51) Int. Cl.
*H04N 25/60* (2023.01)
*H04N 25/75* (2023.01)

(58) Field of Classification Search
CPC ........ H03M 3/43; H03M 3/454; H03M 3/458; H04N 25/60; H04N 25/75
USPC .......................................... 250/208.1, 214 R
See application file for complete search history.

(56) References Cited

U.S. PATENT DOCUMENTS

| | | | |
|---|---|---|---|
| 8,835,828 | B2 | 9/2014 | Kobayashi |
| 9,264,641 | B2 | 2/2016 | Kobayashi |
| 9,357,122 | B2 | 5/2016 | Kususaki et al. |
| 9,407,847 | B2 | 8/2016 | Maehashi et al. |
| 9,438,828 | B2 | 9/2016 | Itano et al. |
| 9,509,931 | B2 | 11/2016 | Kobayashi et al. |
| 9,602,752 | B2 | 3/2017 | Kobayashi et al. |
| 10,015,430 | B2 | 7/2018 | Kobayashi et al. |
| 10,609,316 | B2 | 3/2020 | Kobayashi |
| 11,268,851 | B2 | 3/2022 | Kobayashi et al. |
| 2013/0140440 | A1 | 6/2013 | Kobayashi |
| 2015/0001965 | A1* | 1/2015 | Angeli .................. G06F 1/206 324/705 |
| 2016/0227141 | A1 | 8/2016 | Kobayashi et al. |
| 2020/0265909 | A1 | 8/2020 | Matsuura |
| 2021/0021770 | A1 | 1/2021 | Nakazawa et al. |
| 2021/0021777 | A1 | 1/2021 | Kobayashi et al. |
| 2021/0021782 | A1 | 1/2021 | Sato et al. |
| 2021/0360180 | A1 | 11/2021 | Saito et al. |
| 2021/0391365 | A1 | 12/2021 | Kobayashi et al. |
| 2022/0030164 | A1 | 1/2022 | Kobayashi |
| 2022/0132068 | A1 | 4/2022 | Soda et al. |

FOREIGN PATENT DOCUMENTS

| | | |
|---|---|---|
| JP | 2020-191543 A | 11/2020 |
| WO | 2019/069614 A1 | 4/2019 |

OTHER PUBLICATIONS

U.S. Appl. No. 17/690,229, filed Mar. 9, 2022 (First Named Inventor: Hideo Kobayashi).

U.S. Appl. No. 17/690,236, filed Mar. 9, 2022 (First Named Inventor: Hideo Kobayashi).

U.S. Appl. No. 17/690,255, filed Mar. 9, 2022 (First Named Inventor: Hideo Kobayashi).

* cited by examiner

PHOTOELECTRIC CONVERSION DEVICE, SUBSTRATE, AND EQUIPMENT COMPRISING A CIRCUIT TO DETERMINE AN INTERNAL TEMPERATURE OF THE PHOTOELECTRIC CONVERSION DEVICE BASED ON A CURRENT FOLLOWING IN A RESISTIVE ELEMENT

BACKGROUND OF THE INVENTION

Field of the Invention

The present invention relates to a photoelectric conversion device, a substrate, and an equipment.

Description of the Related Art

There is known a photoelectric conversion device that removes noise from a data signal by performing correlated double sampling. In International Publication No. 2019/069614, a resistive element is connected between an output terminal of a sample-and-hold circuit for a data signal and an output terminal of a sample-and-hold circuit for a reset signal. A current which is proportional to a potential difference between the data signal and the signal will flow in this resistive element. The value of this current will be converted into digital data by an analog-to-digital (A/D) converter and output as a pixel value to an external device.

SUMMARY OF THE INVENTION

The resistance value of the resistive element connected between the output terminal of the sample-and-hold circuit for the data signal and the output terminal of the sample-and-hold circuit for the reset signal changes in accordance with the internal temperature of the photoelectric conversion device. Hence, even if the same voltage is applied to this resistive element, the value of the current flowing in this resistive element will vary in accordance with the internal temperature. As a result, the pixel value to be obtained will also change. An aspect of the present disclosure is to reduce the influence from the change in the internal temperature of the photoelectric conversion device.

According to some embodiments, a photoelectric conversion device includes light receiving circuit configured to convert light into an electrical signal, a first hold circuit configured to hold a data signal which represents the electrical signal converted from the light, a second hold circuit configured to hold a noise signal read out from the light receiving circuit in a reset state, a first resistive element to which a voltage corresponding to a difference between the data signal held by the first hold circuit and the noise signal held by the second hold circuit is applied, an analog-to-digital (A/D) converter configured to convert an analog current flowing in the first resistive element into digital data, a second resistive element, and a temperature detection circuit configured to generate, based on a current flowing in the second resistive element, an analog output corresponding to an internal temperature of the photoelectric conversion device.

Further features of the present invention will become apparent from the following description of exemplary embodiments (with reference to the attached drawings).

DESCRIPTION OF THE EMBODIMENTS

Figure 1:
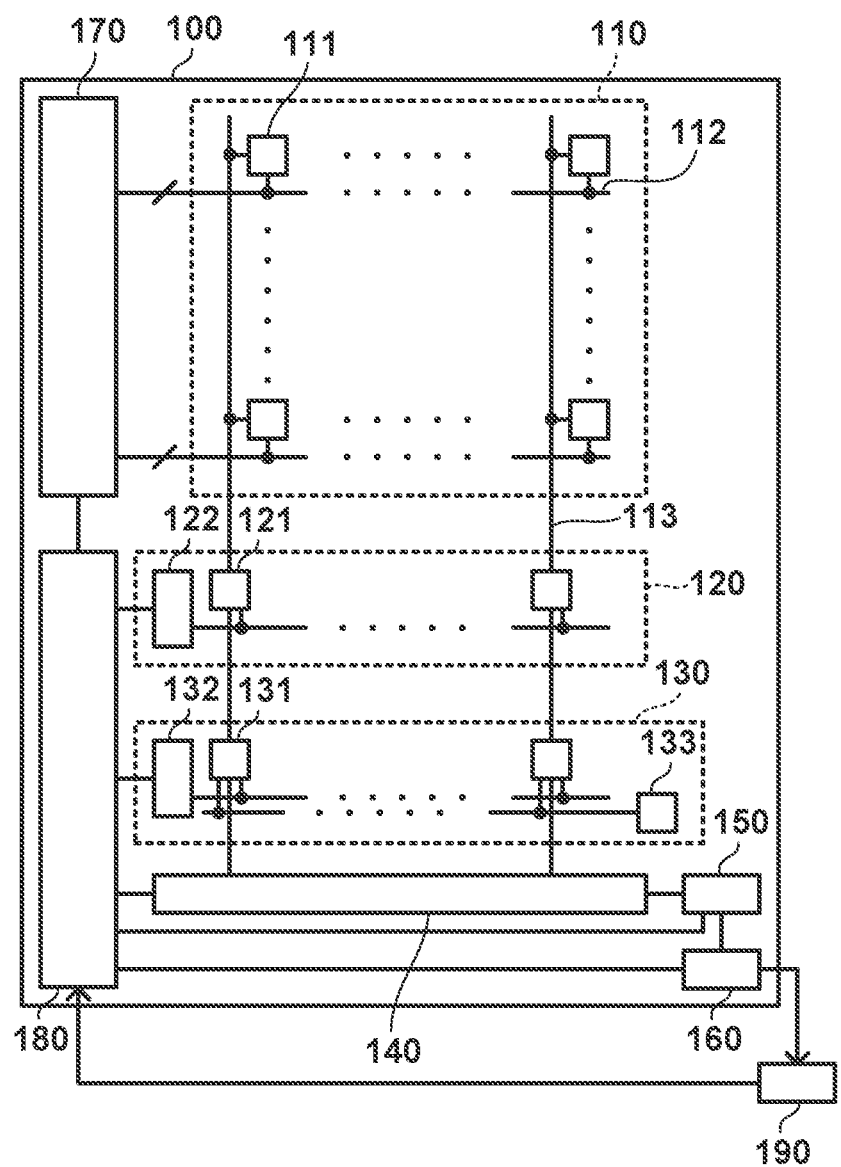
FIG. 1 is a block diagram for explaining an example of the arrangement of a photoelectric conversion device according to a first embodiment.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

An embodiment in which a photoelectric conversion device 100 is used for image capturing will be mainly described hereinafter. In this case, the photoelectric conversion device 100 can be used as an image capturing element (image sensor) for generating an image. Furthermore, other examples of the photoelectric conversion device 100 are a distance measuring element (a sensor used for distance measurement using focus detection or Time Of Flight (TOF), a photometric element (a sensor used to measure an incident light amount or the like), and a Light Detection and Ranging (LiDAR) sensor. The embodiment to be described below is applicable to any photoelectric conversion device.

First Embodiment

An example of the arrangement of a photoelectric conversion device 100 according to the first embodiment will be described with reference to the block diagram of FIG. 1. In the example shown in FIG. 1, the photoelectric conversion device 100 includes a pixel unit 110, a readout unit 120, an A/D conversion unit 130, a horizontal scanning circuit 140, a signal processing circuit 150, an output circuit 160, a vertical scanning circuit 170, and a timing control circuit 180.

The pixel unit 110 includes a plurality of pixel circuits 111 arranged in a two-dimensional array, a plurality of driving lines 112 arranged in correspondence with pixel rows, and a plurality of signal lines 113 arranged in correspondence with pixel columns. The pixel rows refer to the plurality of pixel circuits 111 arranged in the horizontal direction in FIG. 1. The pixel columns refer to the plurality of pixel circuits 111 arranged in the vertical direction in FIG. 1.

Each pixel circuit 111 converts incident light into an electrical signal. Hence, the pixel circuit 111 can also be called a light receiving circuit. A control signal is supplied from the vertical scanning circuit 170 to each of the plurality of pixel circuits 111 via the corresponding driving line 112. The readout unit 120 reads out, via the corresponding signal line 113, an electrical signal from each pixel circuit 111 to which an active-level control signal has been supplied.

The readout unit 120 includes a plurality of readout circuits 121 arranged in correspondence with the signal lines 113 and a control circuit 122 which controls the operation of each of these readout circuit 121. Each readout circuit 121 reads out an analog signal corresponding to the electrical signal generated by the pixel circuit 111, and supplies the analog signal to the A/D conversion unit 130.

The A/D conversion unit 130 includes a plurality of A/D converters 131 arranged in correspondence with the signal lines 113, a control circuit 132 which controls the operation of each of these plurality of A/D converters 131, and a temperature detection circuit 133. Each A/D converter 131 converts an analog signal, supplied from the corresponding readout circuit 121, into a digital signal. In the following description, each A/D converter 131 may be a ΔΣ A/D converter, a slope A/D converter, or a successive-approximation A/D converter. The temperature detection circuit 133 detects the internal temperature of the photoelectric conversion device 100 and supplies an analog output corresponding to this internal temperature to each A/D converter 131.

The horizontal scanning circuit 140 sequentially reads out the digital signals from the plurality of A/D converters 131 and supplies the digital signals to the signal processing circuit 150. The photoelectric conversion device 100 can include a memory circuit for storing each digital signal between the A/D conversion unit 130 and the horizontal scanning circuit 140. The signal processing circuit 150 processes a digital signal corresponding to the electrical signal generated in each pixel circuit 111. The signal processing circuit 150 can execute, for example, correction processing, interpolation processing, and the like on the digital signal.

The digital signal processed by the signal processing circuit 150 is output from the output circuit 160 to an external device 190 which is outside of the photoelectric conversion device 100. The external device 190 can be, for example, a control device of an equipment incorporating the photoelectric conversion device 100. The timing control circuit 180 supplies a control signal to each circuit of the photoelectric conversion device 100 to control the overall operation of the photoelectric conversion device 100.

An example of the arrangement of the more specific circuit arrangement of the pixel circuit 111 will be described with reference to the circuit diagram of FIG. 2. The pixel circuit 111 can have an arbitrary arrangement that converts incident light into an electrical signal. Although an example will be described with reference to FIG. 2, the pixel circuit 111 may also have another arrangement.

Figure 2:
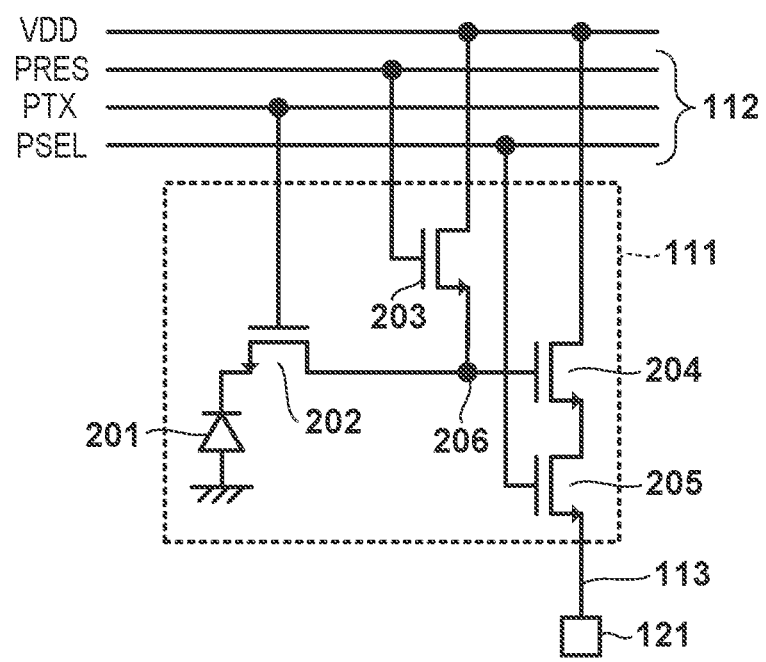
FIG. 2 is a circuit diagram for explaining an example of the circuit arrangement of a pixel circuit according to the first embodiment.

In the example shown in FIG. 2, the pixel circuit 111 includes a photoelectric conversion element 201, a transfer transistor 202, a reset transistor 203, an amplification transistor 204, and a selection transistor 205. In the example of FIG. 2, the pixel unit 110 includes three driving lines 112 for each pixel row, and control signals PRES, PTX, and PSEL are supplied to each pixel circuit 111.

The photoelectric conversion element 201 converts incident light into an electrical charge and accumulates this electrical charge. The photoelectric conversion element 201 can be, for example, a photodiode or a phototransistor. The photoelectric conversion element 201 can also be a Complementary Metal Oxide Semiconductor (CMOS) sensor. Alternatively, the photoelectric conversion element 201 can be a Single Photon Avalanche Diode (SPAD) sensor.

The photoelectric conversion element 201 is connected to a floating diffusion 206 via the transfer transistor 202. The control signal PTX is supplied from the vertical scanning circuit 170 to the gate of the transfer transistor 202. The transfer transistor 202 is set in a conductive state in accordance with the control signal PTX being set to the active level. Accordingly, the signal charge accumulated in the photoelectric conversion element 201 is transferred to the floating diffusion 206.

The floating diffusion 206 is also connected to the gate of the amplification transistor 204. One main electrode of the amplification transistor 204 is connected to the signal line 113 via the selection transistor 205. The other main electrode of the amplification transistor 204 is connected to a power supply potential VDD. The control signal PSEL is supplied from the vertical scanning circuit 170 to the gate of the selection transistor 205. The selection transistor 205 is set in a conductive state in accordance with the control signal PSEL being set to the active level. Accordingly, one of the main electrodes of the amplification transistor 204 is connected to the current source of the readout circuit 121. As a result, the amplification transistor 204 will operate as a source follower, and a signal corresponding to the potential of the floating diffusion 206 is read out to the signal line 113.

The reset transistor 203 is connected between the floating diffusion 206 and the power supply potential VDD. The control signal PRES is supplied from the vertical scanning circuit 170 to the gate of the reset transistor 203. The reset transistor 203 is set in a conductive state in accordance with the control signal PRES being set to the active level. Accordingly, the potential of the floating diffusion 206 is reset to the power supply potential VDD.

A more specific example of the circuit arrangement of the readout circuit 121 will be described with reference to the circuit diagram of FIG. 3. The readout circuit 121 can have an arbitrary arrangement that reads out the electrical signal generated by the pixel circuit 111. Although an example will be described with reference to FIG. 3, the readout circuit 121 may have another arrangement.

Figure 3:
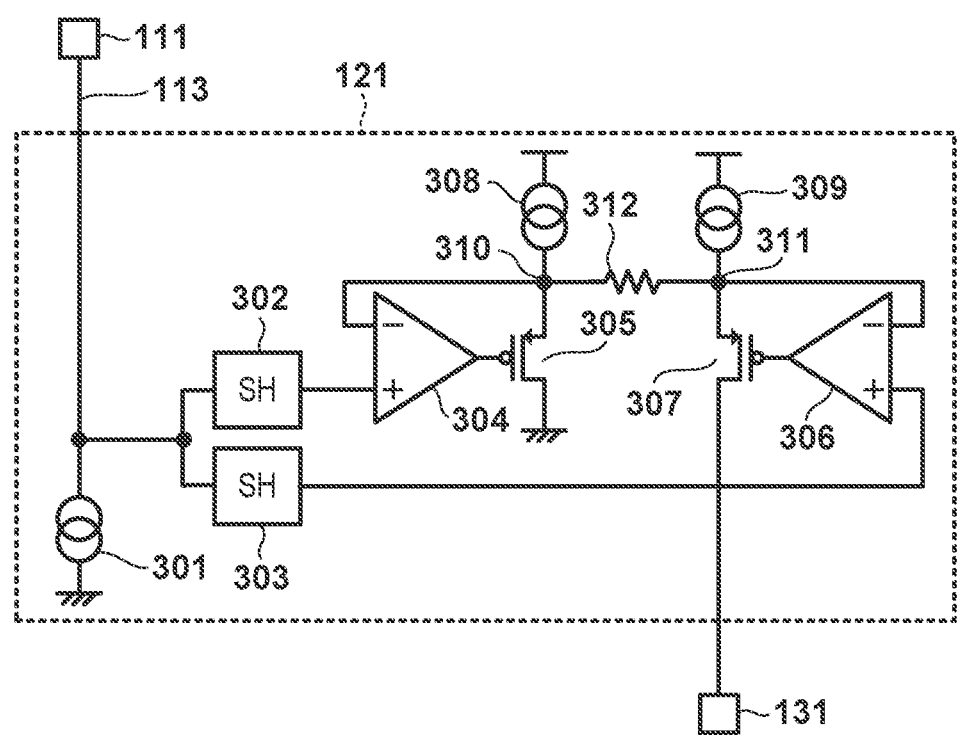
FIG. 3 is a circuit diagram for explaining an example of the circuit arrangement of the pixel circuit according to the first embodiment.

In the example shown in FIG. 3, the readout circuit 121 includes current sources 301, 308, and 309, sample-and-hold circuits 302 and 303, amplifiers 304 and 306, transistors 305 and 307, and a resistive element 312.

The current source 301 supplies a bias current to the pixel circuit 111 (more specifically, the amplification transistor 204 thereof). Each of the sample-and-hold circuits 302 and 303 holds an output voltage from the pixel circuit 111. Each sample-and-hold circuit can also be referred to as a hold circuit. The timing control circuit 180 controls the pixel circuit 111 so that an electrical signal (to be referred to as a noise signal hereinafter) obtained when the photoelectric conversion element 201 is in a reset state and an electrical signal (to be referred to as a data signal hereinafter) corresponding to the incident light will be output. The control circuit 122 will control, in accordance with an instruction from the timing control circuit 180, the readout circuit 121 to read out the noise signal and to hold the noise signal in the sample-and-hold circuit 302. The control circuit 122 also will control, in accordance with an instruction from the timing control circuit 180, the readout circuit 121 to read out the data signal from the pixel circuit 111 and to hold the data signal in the sample-and-hold circuit 303.

The amplifier 304 and the transistor 305 function as a source follower. The current source 308 supplies a bias current to this source follower. The potential of a node 310 between the current source 308 and the transistor 305 will have a value corresponding to the voltage (noise signal) held in the sample-and-hold circuit 302.

The amplifier 306 and the transistor 307 function as a source follower. The current source 309 supplies a bias current to this source follower. The potential of a node 311 between the current source 309 and the transistor 307 will have a value corresponding to the voltage (data signal) held in the sample-and-hold circuit 303.

The resistive element 312 is connected between the node 310 and the node 311. Hence, the voltage applied to the resistive element 312 will be the potential difference between the node 310 and the node 311. In other words, a voltage corresponding to the difference between the noise signal held in the sample-and-hold circuit 302 and the data signal held in the sample-and-hold circuit 303 will be applied to the resistive element 312. Hence, an analog current signal corresponding to the difference between the data signal and the noise signal will be supplied from the readout circuit 121 to the A/D converter 131. In this manner, the readout circuit 121 has a function to execute correlated double sampling (CDS).

A more specific example of the circuit arrangement of the A/D converter 131 will be described with reference to the block diagrams of FIGS. 4A and 4B. The A/D converter 131 is a $\Delta\Sigma$ A/D converter. The A/D converter 131 converts an input analog signal into a digital signal. The A/D converter 131 of FIG. 4A includes a first-order $\Delta\Sigma$ modulator 404 and a decimation filter 405. The A/D converter 131 of FIG. 4B includes a second-order $\Delta\Sigma$ modulator 407 and the decimation filter 405. Alternatively, the A/D converter 131 may include a $\Delta\Sigma$ A/D converter of third order or more. Using a $\Delta\Sigma$ A/D converter of a higher order will improve the effect of noise shaping. Each of the $\Delta\Sigma$ modulators 404 and 407 will convert an input analog signal into a 1-bit digital signal sequence. The decimation filter 405 will perform decimation processing (thinning processing) on this 1-bit digital signal sequence. For example, the decimation filter 405 will generate a digital signal corresponding to the ratio of the time in which the 1-bit digital signal sequence becomes 1 during a predetermined time length. The $\Delta\Sigma$ modulator 404 may also convert the input analog signal into a digital signal sequence of 2 bits or more.

Figure 4A:
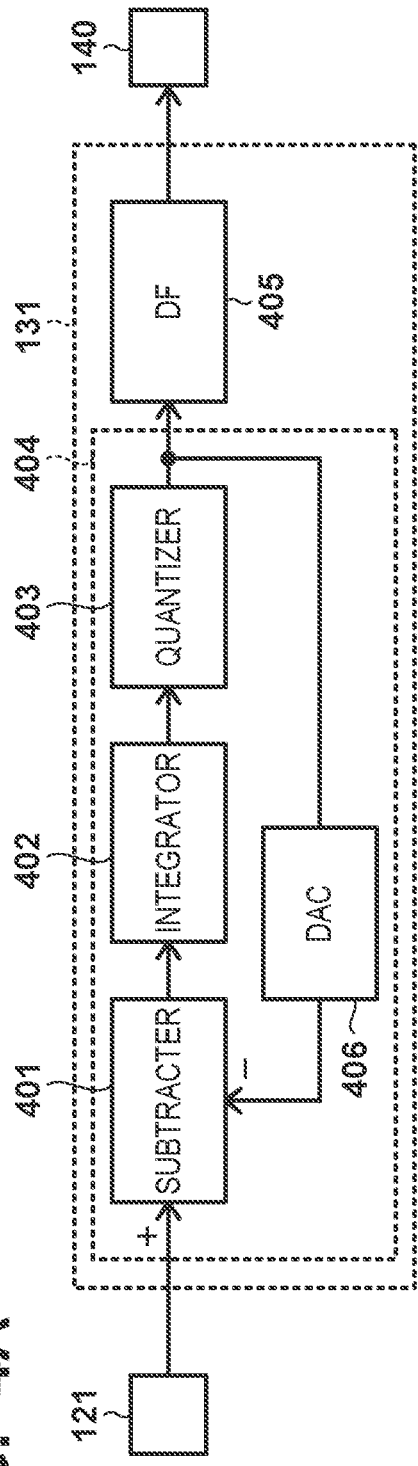
FIGS. 4A and 4B are block diagrams for explaining an example of the circuit arrangement of a readout circuit according to the first embodiment.

As shown in FIG. 4A, the first-order $\Delta\Sigma$ modulator 404 includes a subtractor 401, an integrator 402, a quantizer 403, and a digital-to-analog (D/A) converter (DAC) 406. An input to the A/D converter 131 (that is, the analog signal from the readout circuit 121) is supplied to the subtractor 401. In addition, the analog signal from the D/A converter 406 is also supplied to the subtractor 401. The subtractor 401 supplies, to the integrator 402, the difference between the analog signal from the readout circuit 121 and the analog signal from the D/A converter 406.

The integrator 402 integrates the output from the subtractor 401. The quantizer 403 quantizes the integration result from the integrator 402. For example, the quantizer 403 will generate a 1-bit digital signal sequence based on this integration result and supply this result to the decimation filter 405. The output from the quantizer 403 will be the output from the $\Delta\Sigma$ modulator 404.

The output from the quantizer 403 is also supplied to the D/A converter 406. The D/A converter 406 generates a signal corresponding to the output from the quantizer 403, and supplies the signal to the subtractor 401. The signal supplied from the D/A converter 406 to the subtractor 401 is subtracted from the analog signal supplied from the readout circuit 121 in the manner described above.

Figure 4B:
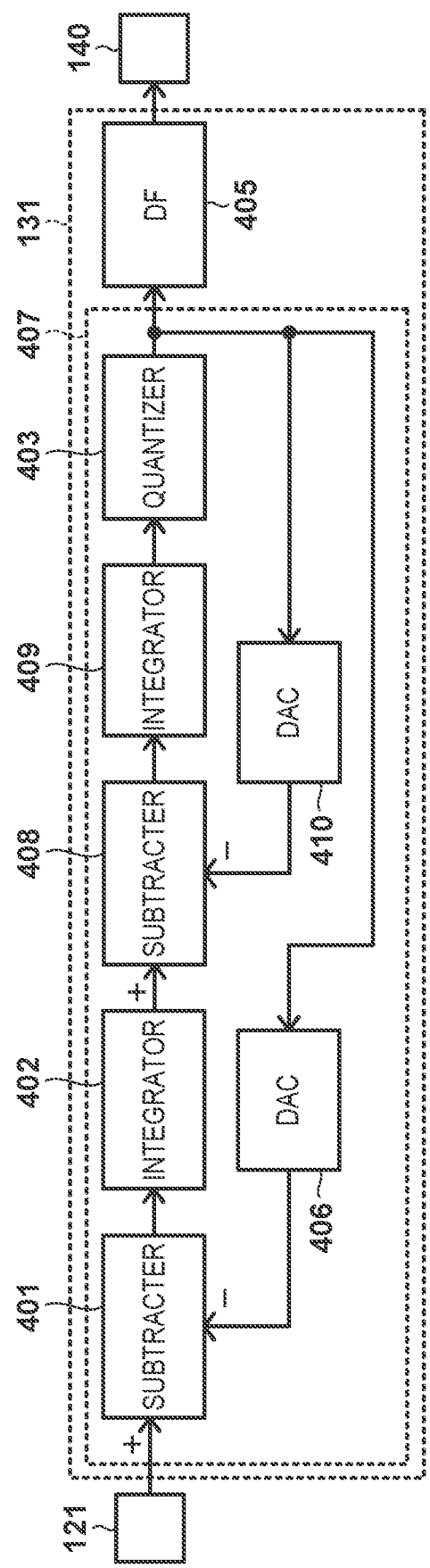

As shown in FIG. 4B, the second-order $\Delta\Sigma$ modulator 407 includes the subtractor 401, a subtractor 408, the integrator 402, an integrator 409, the quantizer 403, the D/A converter (DAC) 406, and a D/A converter (DAC) 410. The arrangement of the subtractor 401, the integrator 402, the quantizer 403, and the D/A converter 406 is the similar to that of the first-order $\Delta\Sigma$ modulator 404.

The output from the integrator 402 is supplied to the subtractor 408. In addition, the analog signal from the D/A converter (DAC) 410 is also supplied to the subtractor 408. The subtractor 408 supplies, to the integrator 409, the difference between the analog signal from the integrator 402 and the analog signal from the D/A converter (DAC) 410. The integrator 409 integrates the output from the subtractor 408. The quantizer 403 quantizes the integration result from the integrator 409.

The output from the quantizer 403 is also supplied to the D/A converter (DAC) 410. The D/A converter (DAC) 410 generates a signal corresponding to the output from the quantizer 403 and supplies this signal to the subtractor 408. The signal supplied from the D/A converter (DAC) 410 to the subtractor 408 will be subtracted from the analog signal supplied from the integrator 402 in the above-described manner.

Figure 5A:
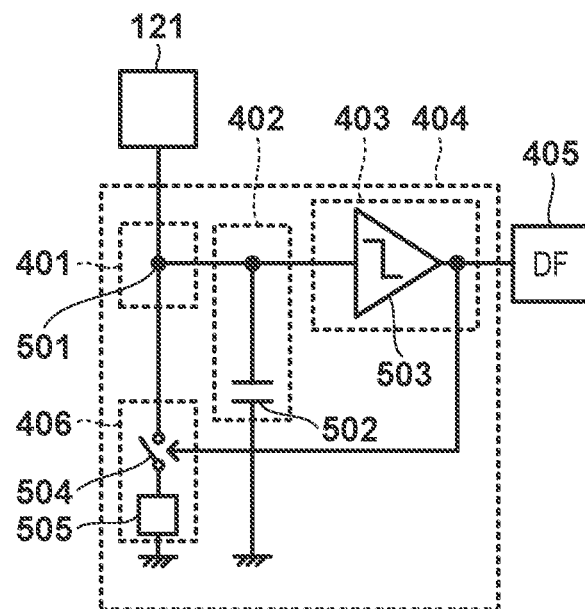
FIGS. 5A and 5B are circuit diagrams for explaining an example of the circuit arrangement of a $\Delta\Sigma$ modulator according to the first embodiment.
Figure 5B:
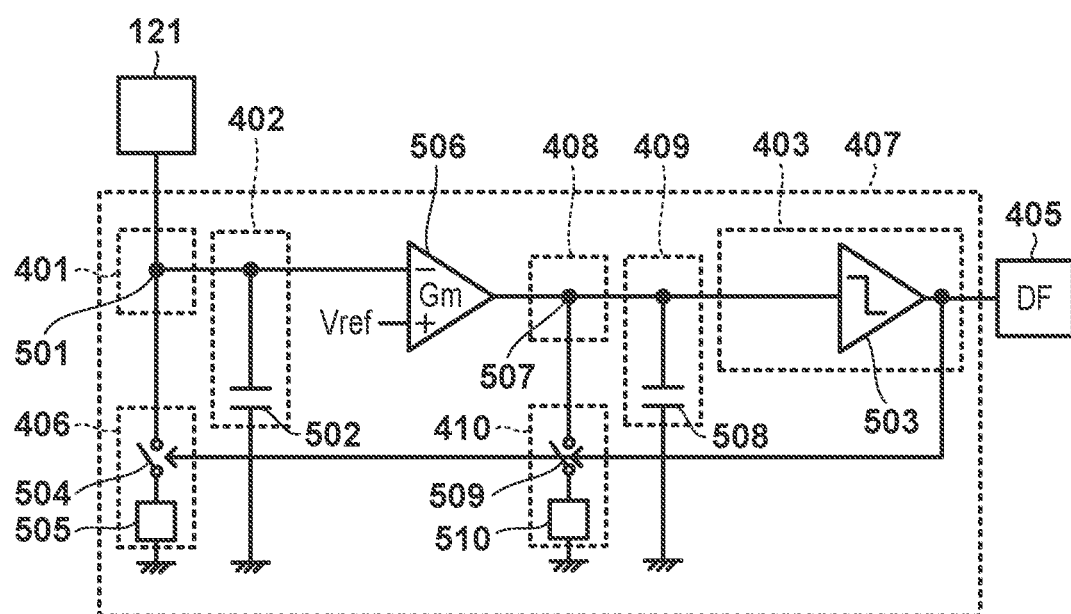

An example of the circuit arrangement of the $\Delta\Sigma$ modulators 404 and 407 when an analog current signal is to be input to the A/D converter 131 will be described next with reference to FIGS. 5A and 5B. FIG. 5A shows an example of the circuit arrangement of the first-order $\Delta\Sigma$ modulator 404, and FIG. 5B shows an example of the circuit arrangement of the second-order $\Delta\Sigma$ modulator 407.

The example of the circuit arrangement of the first-order $\Delta\Sigma$ modulator 404 will be described first. The subtractor 401 is formed by a node 501 which is connected to the readout circuit 121, the D/A converter 406, and the integrator 402. An analog current from the D/A converter 406 is subtracted from an analog current signal supplied from the readout circuit 121 to the node 501. The current obtained as a result is supplied to the integrator 402.

The integrator 402 is formed by a capacitor 502. The capacitor 502 is charged by an output from the subtractor 401 so that the output would be integrated. The voltage of the capacitor 502 is supplied to the quantizer 403. The quantizer 403 is formed by a comparator 503. The comparator 503 outputs a voltage at high level or low level in accordance with the value of the voltage supplied from the integrator 402.

The D/A converter 406 is formed by a switch element 504 and a current generation circuit 505. The current generation circuit 505 generates an analog current to be supplied to the subtractor 401. The switch element 504 is positioned on a signal path between the subtractor 401 and the current generation circuit 505. The switch element 504 is switched on/off based on the output from the quantizer 403. The switch element 504 is set to ON when the output from the quantizer 403 is high level. As a result, a current is supplied from the current generation circuit 505 to subtractor 401. On the other hand, the switch element 504 is set to OFF when the output from the quantizer 403 is low level. As a result, a current is not supplied from the current generation circuit 505 to the subtractor 401. In this manner, the value of the analog current supplied from the D/A converter 406 to the subtractor 401 changes in accordance with the output from the quantizer 403.

An example of the circuit arrangement of the second-order ΔΣ modulator 407 will be described next. The ΔΣ modulator 407 includes the subtractors 401 and 408, the integrators 402 and 409, a gm amplifier 506, the quantizer 403, and the D/A converters 406 and 410. The circuit arrangement of the subtractor 401, the integrator 402, the quantizer 403, and the D/A converter 406 is similar to that of the first-order ΔΣ modulator 404. The gm amplifier 506 is an amplifier that converts an analog voltage signal supplied from the integrator 402 into an analog current signal and supplies the analog current signal to the subtractor 408. An analog voltage signal is supplied from the integrator 402 to the inverting input terminal of the gm amplifier 506, and a reference voltage Vref is supplied from the control circuit 132 to the non-inverting input terminal of the gm amplifier 506.

The subtractor 408 is formed by a node 507 which is connected to the gm amplifier 506, the D/A converter 410, and the integrator 409. An analog current from the D/A converter 410 is subtracted from an analog current signal supplied to the node 507 from the gm amplifier 506, and the current obtained as a result is supplied to the integrator 409. The integrator 409 is formed by a capacitor 508.

The capacitor 508 is charged by an output from the gm amplifier 506 so that the output will be integrated. The voltage of the capacitor 508 is supplied to the quantizer 403.

The D/A converter 410 is formed by a switch element 509 and a current generation circuit 510. The current generation circuit 510 generates an analog current to be supplied to the subtractor 408. The switch element 509 is positioned on a signal path between the subtractor 408 and the current generation circuit 510. The switch element 509 is switched on/off based on the output from the quantizer 403. The switch element 509 is set to ON when the output from the quantizer 403 is high level. As a result, a current is supplied from the current generation circuit 510 to the subtractor 408. On the other hand, the switch element 509 is set to OFF when the output from the quantizer 403 is low level. As a result, a current is not supplied from current generation circuit 510 to the subtractor 408. In this manner, the value of the analog current supplied from the D/A converter 416 to the subtractor 408 changes in accordance with the output from the quantizer 403.

A more specific example of the circuit arrangement of the current generation circuit 505 and the temperature detection circuit 133 will be described with reference to the circuit diagram of FIG. 6. The temperature detection circuit 133 can have an arbitrary arrangement that generates an analog output corresponding to the internal temperature of the photoelectric conversion device 100. The current generation circuit 505 can have an arbitrary arrangement that generates a current corresponding to the analog output supplied from the temperature detection circuit 133.

Figure 6:
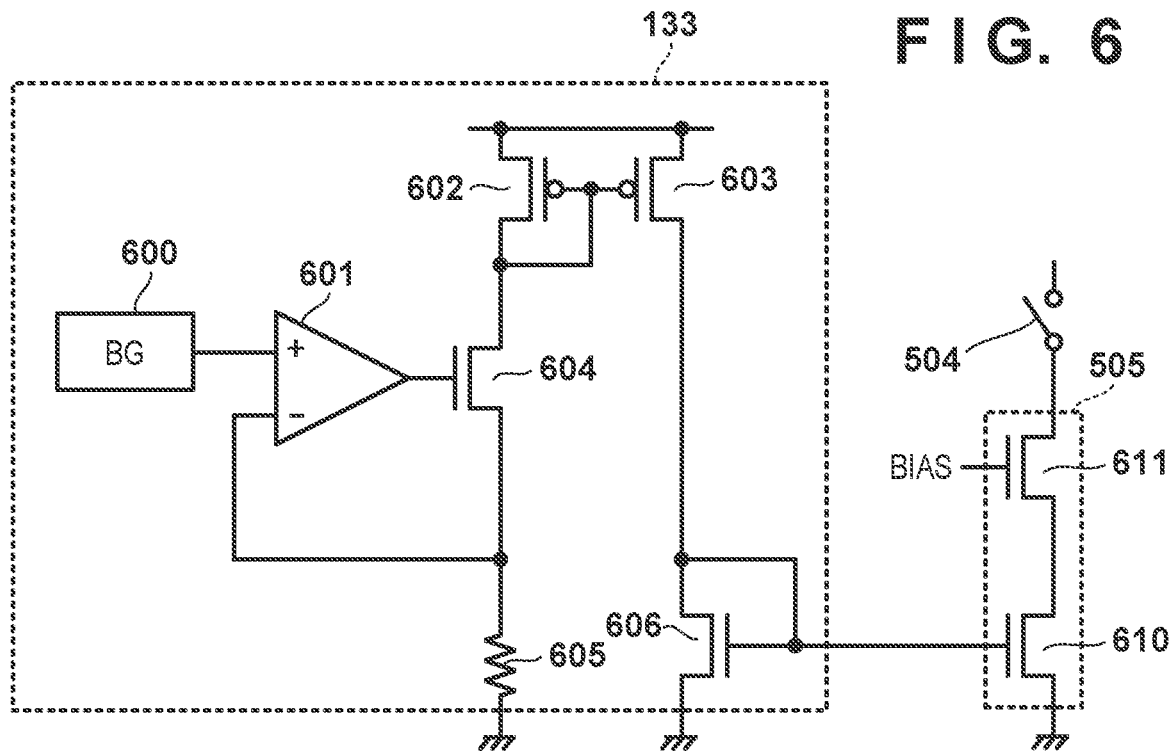
FIG. 6 is a circuit diagram for explaining an example of the circuit arrangement of a current generation circuit and a temperature detection circuit according to the first embodiment.

The temperature detection circuit 133 can include a circuit element as shown in FIG. 6. A bandgap circuit 600 supplies a constant voltage to the non-inverting input terminal of an operation amplifier 601. The non-inverting input terminal of the operation amplifier 601 is connected to ground via a resistive element 605. The output terminal of the operation amplifier 601 is connected to the gate of an n-type transistor 604. The source of the n-type transistor 604 is connected to ground via the resistive element 605. The drain of the n-type transistor 604 is connected to one terminal of a current mirror circuit which is formed by p-type transistors 602 and 603. The other terminal of the current mirror circuit formed by the p-type transistors 602 and 603 is connected to ground via an n-type transistor 606. The gate and the drain of the n-type transistor 606 are short-circuited. The gate voltage from the n-type transistor 606 is supplied as an output from the temperature detection circuit 133 to the current generation circuit 505. In this manner, the temperature detection circuit 133 generates, based on the current flowing in the resistive element 605, an analog voltage output corresponding to the internal temperature of the photoelectric conversion device 100.

The current generation circuit 505 includes n-type transistors 610 and 611 which are cascade-connected. The analog voltage from the temperature detection circuit 133 is supplied as a bias voltage to the gate of the n-type transistor 610. Another bias voltage (for example, from the control circuit 132 of the A/D conversion unit 130) is supplied to the gate of the n-type transistor 611. Hence, the current generation circuit 505 will generate a current corresponding to the analog voltage supplied from the temperature detection circuit 133 and supply the current to the switch element 504.

The change in the internal temperature of the photoelectric conversion device 100 will have a very small influence on the bandgap circuit 600. Hence, it can be assumed that the bandgap circuit 600 will supply a constant voltage to the operation amplifier 601 regardless of the internal temperature of the photoelectric conversion device 100. An example in which the bandgap circuit 600 will output a voltage of 1.2 V will be described hereinafter. Since it can be assumed that the voltage between both input terminals of the operation amplifier 601 is zero, the voltage to be applied to the resistive element 605 will be 1.2 V. Hence, letting R[Ω] be the resistance value of the resistive element 605, a current of 1.2/R [A] will flow in the resistive element 605. The gate voltage of the n-type transistor 606 depends on the value of the current flowing in the n-type transistor 606. Hence, the value of the analog output voltage from the temperature detection circuit 133 will also change when the resistance value of the resistive element 605 changes. As a result, the value of the current generated by the current generation circuit 505 will also change.

Assume that the resistance value of the resistive element 312 has increased in accordance with the change in the internal temperature of the photoelectric conversion device 100. In this case, the value of the signal (that is, the pixel signal after correlated double sampling) to be supplied to the A/D conversion unit 130 will be small even if the amount of incident light to the pixel circuit 111 is the same. In this embodiment, the resistance value of the resistive element 605 will increase in accordance with the change in the internal temperature of the photoelectric conversion device 100. Since the value of the current generated by the current generation circuit 505 will also decrease in accordance with this change, the gain of the A/D converter 131 will increase. As a result, it will reduce the decrease in the pixel signal caused by the change in the internal temperature of the photoelectric conversion device 100. In a similar manner, when the resistance value of the resistive element 312 decreases in accordance with the change in the internal temperature of the photoelectric conversion device 100, it will also reduce the increase in the pixel signal caused by this temperature change. In this manner, the analog output generated by the temperature detection circuit 133 will change the gain of the A/D converter 131 so as to reduce the variation in the pixel signal which occurs due to the change in the internal temperature of the photoelectric conversion device 100.

The resistive element 312 and the resistive element 605 can be formed to have similar temperature characteristics. For example, the resistive element 312 and the resistive element 605 can be made of the same material. The resistive element 312 and the resistive element 605 can be poly resistors, diffusion resistors, metal resistors, or the like. Alternatively, the resistive element 312 and the resistive element 605 can be formed on the same substrate. For example, if the photoelectric conversion device 100 is formed by joining a plurality of substrates, the resistive element 312 and the resistive element 605 can be formed on the same single substrate among the plurality of substrates. Process variation between these resistive elements can be reduced by forming these resistive elements on the same substrate.

Figure 7:
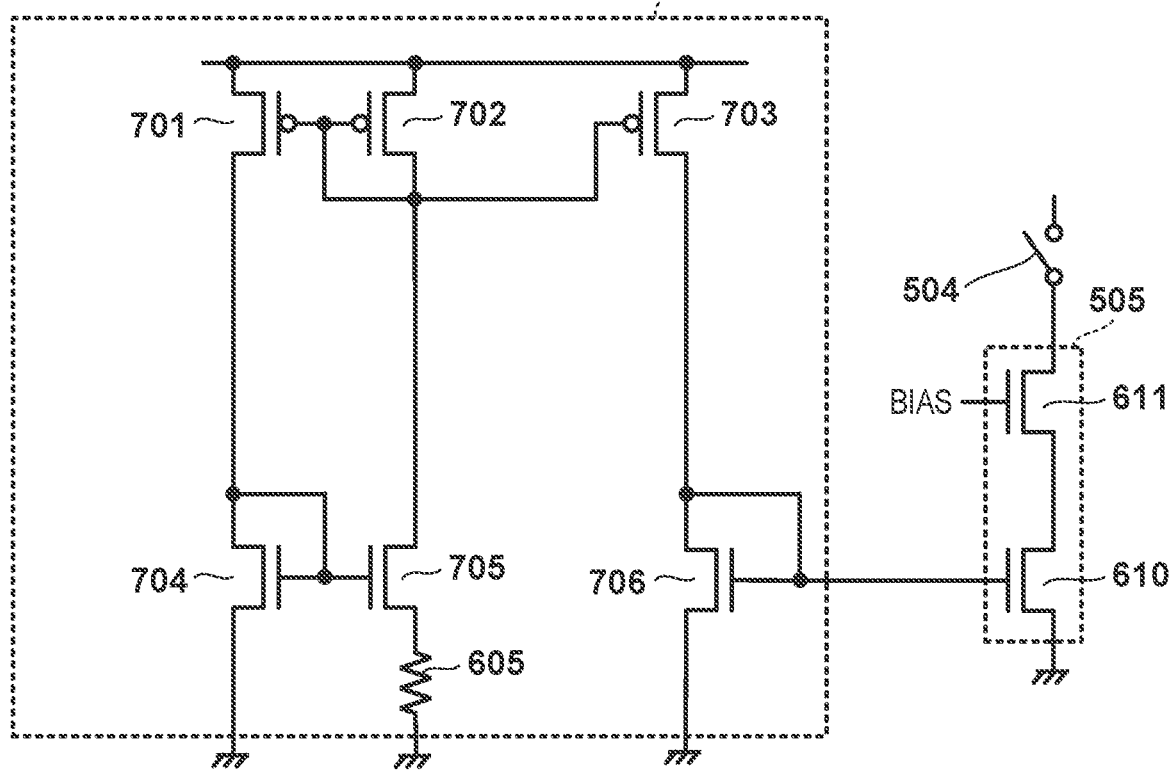
FIG. 7 is a circuit diagram for explaining another example of the circuit arrangement of the current generation circuit and the temperature detection circuit according to the first embodiment.

Another example of the circuit arrangement of the current generation circuit 505 will be described with reference to the circuit diagram of FIG. 7. The temperature detection circuit 133 can include a circuit element shown in FIG. 7. P-type transistors 701 to 703 form a current mirror circuit. N-type transistors 704 and 705 form a current mirror circuit. The source of the n-type transistor 705 is connected to ground via the resistive element 605. The drain of the p-type transistor 703 is connected to ground via an n-type transistor 706. The gate and the drain of the n-type transistor 706 are short-circuited. The gate voltage of the n-type transistor 706 is supplied as an output from the temperature detection circuit 133 to the current generation circuit 505. Even in this kind of circuit arrangement, the value of the analog output voltage from the temperature detection circuit 133 will change when the resistance value of the resistive element 605 changes.

In the example described above, the analog output voltage from the temperature detection circuit 133 is supplied to the current generation circuit 505, and the value of the current generated by the current generation circuit 505 changed. Alternatively or in addition to this, the value of the current of generated by the current generation circuit 510 can also change when the analog output voltage from the temperature detection circuit 133 is supplied to the current generation circuit 510. This modification will also allow the analog output generation by the temperature detection circuit 133 to change the gain of the A/D converter 131 so as to reduce the variation in the pixel signal caused by the change in the internal temperature of the photoelectric conversion device 100.

Second Embodiment

Figure 8:
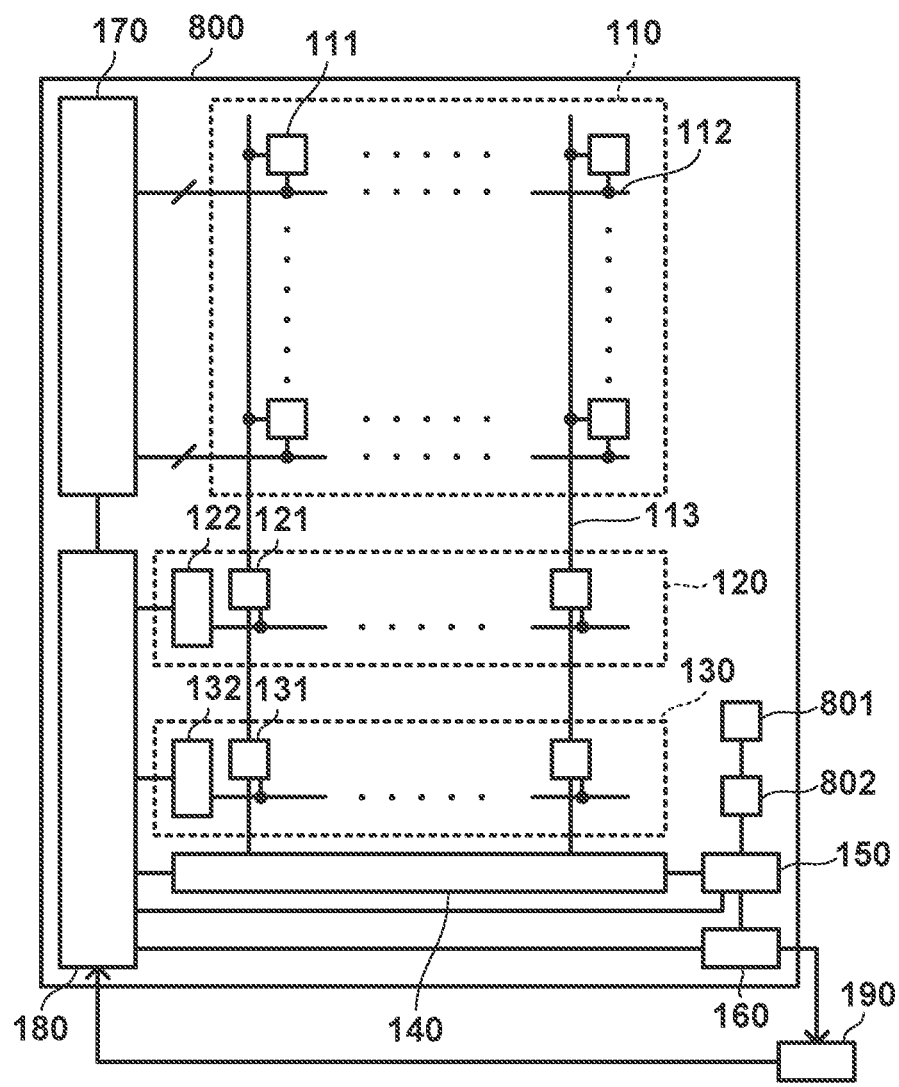
FIG. 8 is a block diagram for explaining an example of the arrangement of a photoelectric conversion device according to a second embodiment.

An example of the arrangement of a photoelectric conversion device 800 according to the second embodiment will be described with reference to the block diagram of FIG. 8. Components of the photoelectric conversion device 800 according to the second embodiment which may be similar to those of a photoelectric conversion device 100 according to the first embodiment will be denoted with the same reference numerals, and a redundant description will be omitted. The photoelectric conversion device 800 differs from the photoelectric conversion device 100 in the point that a temperature detection circuit 801 and an A/D converter 802 are included instead of a temperature detection circuit 133.

The temperature detection circuit 801 detects the internal temperature of the photoelectric conversion device 800 and supplies an analog output corresponding to this internal temperature to the A/D converter 802. The A/D converter 802 converts the analog output supplied from the temperature detection circuit 801 into digital data, and supplies the digital data to a signal processing circuit 150. The A/D converter 802 may be formed to be either a $\Delta\Sigma$ A/D converter, a slope A/D converter, or a successive-approximation A/D converter. In addition, the type of the A/D converter 802 may be the same as or different from the A/D converter 131. The signal processing circuit 150 estimates the internal temperature of the photoelectric conversion device 100 based on the digital data supplied from the A/D converter 802. The signal processing circuit 150 corrects, based on the estimated internal temperature, each pixel signal (that is, each output from an A/D conversion unit 130) so as to suppress a variation in the pixel signal caused by the change in the resistance value of a resistive element 312.

Figure 9:
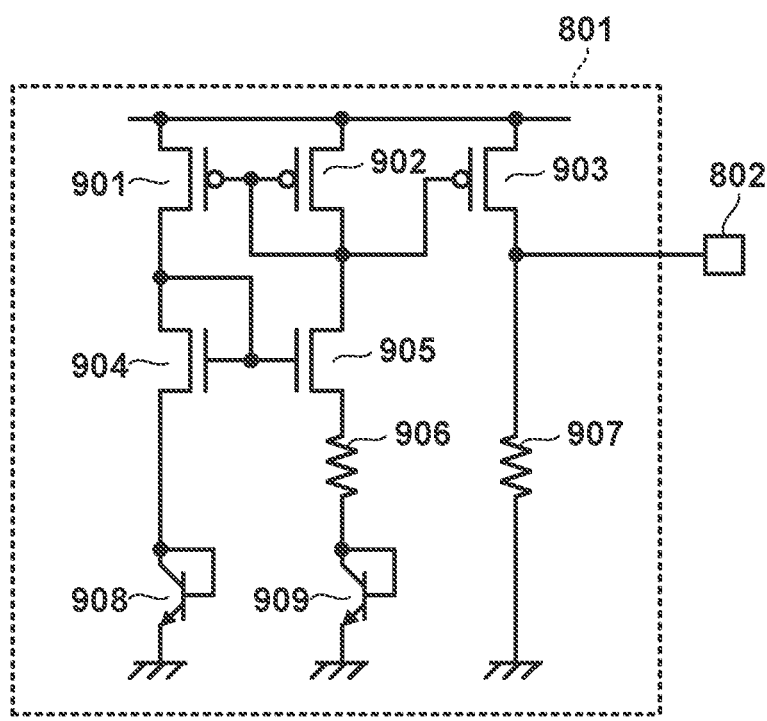
FIG. 9 is a circuit diagram for explaining an example of the circuit arrangement of a temperature detection circuit according to the second embodiment.

A more specific example of the circuit arrangement of the temperature detection circuit 801 will be described with reference to the circuit diagram of FIG. 9. The temperature detection circuit 801 can have an arbitrary arrangement that generates an analog output corresponding to the internal temperature of the photoelectric conversion device 800. The temperature detection circuit 801 can include the circuit element shown in FIG. 9.

P-type transistors 901 to 903 form a current mirror circuit. N-type transistors 904 and 905 form a current mirror circuit. The source of the n-type transistor 904 is connected to ground via a bipolar transistor 908. The source of the n-type transistor 905 is connected to ground via a resistive element 906 and a bipolar transistor 909. The drain of the p-type transistor 903 is connected to ground via a resistive element 907. The voltage value of a node between the p-type transistor 903 and the resistive element 907 is supplied as an analog output to the A/D converter 802.

Assume that the emitter size of the bipolar transistor 909 is n times the emitter size of the bipolar transistor 908. In this case, the collector potential of the bipolar transistor 908 increases by Vt×log(n) when compared to the collector potential of the bipolar transistor 909. Here, Vt is a value proportional to the internal temperature of the photoelectric conversion device 100 and will be about 26 mV at room temperature. Letting R1[Ω] be the resistance value of the resistive element 906, the current flowing in the resistive element 906 will be Vt×log(n)/R1[A]. Letting R2[Ω] be the resistance value of the resistive element 907, the output voltage from the temperature detection circuit 801 will be Vt×log(n)×(R2/R1)[A]. In this manner, the temperature detection circuit 801 will generate, based on the current flowing in the resistive elements 906 and 907, an analog voltage output corresponding to the internal temperature of the photoelectric conversion device 800.

The signal processing circuit 150 estimates the internal temperature of the photoelectric conversion device 800 based on the digital data supplied from the A/D converter 802. The signal processing circuit 150 corrects the pixel signal based on the estimated internal temperature. For example, a correspondence table of the internal temperatures of the photoelectric conversion device 800 and the respective correction values can be stored in advance in the signal processing circuit 150. The signal processing circuit 150 can determine the correction value of the pixel signal by checking and comparing the estimated internal temperature with respect to this correspondence table. In this manner, the signal processing circuit 150 will correct each pixel signal so as to reduce the variation in the pixel signal caused by the change in the internal temperature of the photoelectric conversion device 800.

In the example described above, the signal processing circuit 150 estimated the internal temperature of the photoelectric conversion device 800 and corrected the digital data expressing the pixel signal. Alternatively, a control circuit 132 of the A/D conversion unit 130 may estimate the internal temperature of the photoelectric conversion device 800 based on the digital data supplied from the A/D converter 802, and change the gain of an A/D converter 131 based on the estimated internal temperature. The control circuit 132 will change the gain of the A/D converter 131 so as to reduce the variation in the pixel signal caused by the change in the internal temperature of the photoelectric conversion device 800.

More specifically, changing the gain of the A/D converter 131 can include changing the value of an analog current supplied from a D/A converter 406 to a subtractor 401 with respect to the same output from the quantizer 403. In addition, changing the setting of the A/D converter 131 can include changing the value of an analog current supplied from a D/A converter 410 to a subtractor 408 with respect to the same output from the quantizer 403.

Changing the gain of the A/D converter 131 can also include changing the value of a reference voltage Vref supplied to a gm amplifier 506. Changing the value of the reference voltage Vref will change the output from the gm amplifier 506 with respect to the same output from an integrator 402. This will change the gain of the A/D converter 131 as a result.

Changing the gain of the A/D converter 131 can also include changing the setting of a decimation filter 405. The setting to be changed can be, for example, the constant of the decimation filter 405 or the frequency of the clock signal of the decimation filter 405.

In the example described above, the signal processing circuit 150 estimated the internal temperature of the photoelectric conversion device 800 and corrected the digital data expressing the pixel signal. Alternatively, the signal processing circuit 150 may output the estimated internal temperature to an external device 190 through an output circuit 160. As a result, the digital data expressing the pixel signal can be corrected by the external device 190 based on the estimated internal temperature.

Third Embodiment

Figure 10:
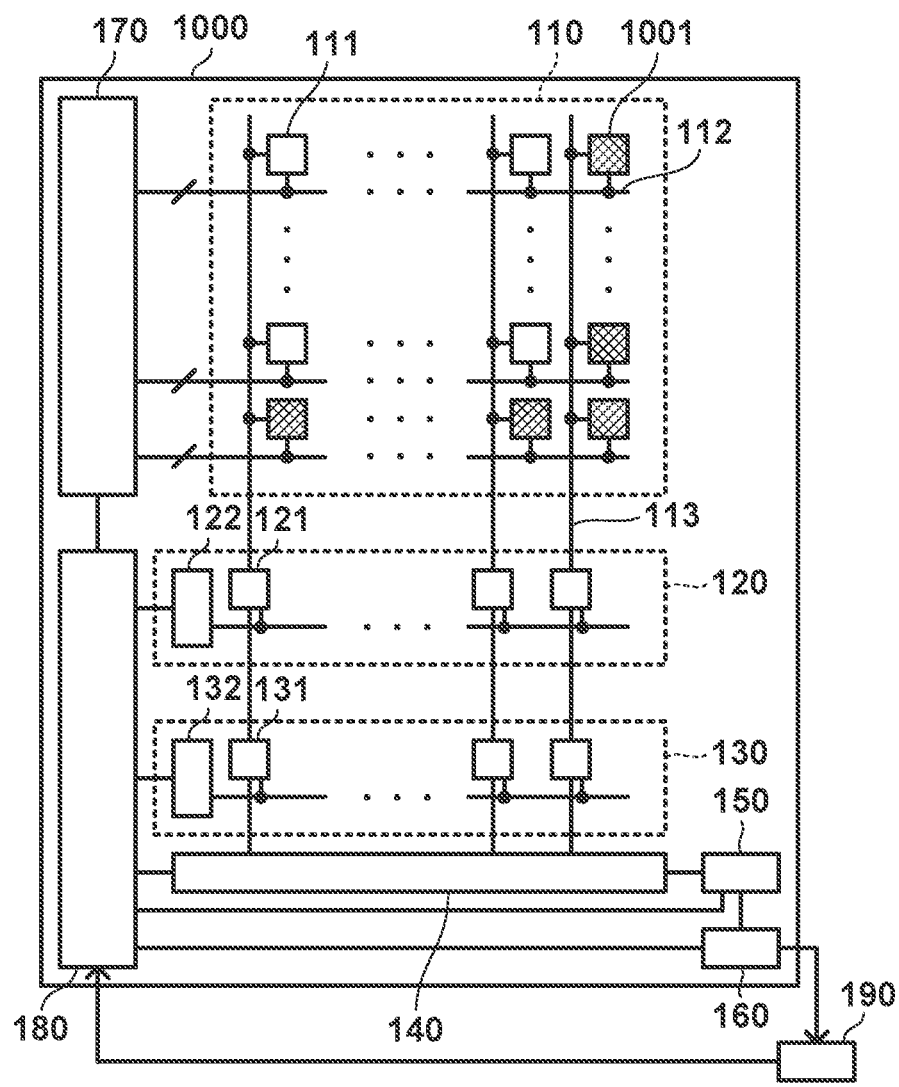
FIG. 10 is a block diagram for explaining an example of the arrangement of a photoelectric conversion device according to a third embodiment.

An example of the arrangement of a photoelectric conversion device 1000 according to the third embodiment will be described with reference to the block diagram of FIG. 10. Components of the photoelectric conversion device 1000 according to the third embodiment which may be similar to those of a photoelectric conversion device 800 according to the second embodiment will be denoted with the same reference numerals, and a redundant description will be omitted. The photoelectric conversion device 1000 differs from the photoelectric conversion device 800 in that a temperature detection circuit 133 is not included but optical black pixel circuits 1001 are included.

Compared to a pixel circuit 111, each optical black pixel circuit 1001 may be different in the point that a photoelectric conversion element 201 is covered by a light-shielding layer, but may be otherwise similar to the photoelectric conversion element 201. The optical black pixel circuits 1001 form a pixel unit 110 together with the pixel circuits 111. Even when the pixel unit 110 is irradiated with light, the light will not substantially reach the photoelectric conversion element 201 of the optical black pixel circuit 1001.

In the third embodiment, a signal processing circuit 150 will estimate the internal temperature of the photoelectric conversion device 1000 based on the signal read out from each optical black pixel circuit 1001. A signal read out from each optical black pixel circuit 1001 depends on the value of a dark current, and the dark current depends on the temperature of the photoelectric conversion device 1000. Hence, the internal temperature of the photoelectric conversion device 1000 can be estimated based on the signals read out from the optical black pixel circuits 1001. The signal processing circuit 150 corrects each pixel signal based on the estimated internal temperature. For example, a correspondence table of the internal temperatures of the photoelectric conversion device 1000 and the respective correction values can be stored in advance in the signal processing circuit 150. The signal processing circuit 150 can determine the correction value of each pixel signal by checking and comparing the estimated internal temperature with respect to this correspondence table. In this manner, the signal processing circuit 150 will correct each pixel signal so as to reduce the variation in the pixel signal caused by the change in the internal temperature of the photoelectric conversion device 1000.

In a similar manner to the second embodiment, a control circuit 132 of an A/D conversion unit 130 may estimate the internal temperature of the photoelectric conversion device 1000 based on the signal read out from each optical black pixel circuit 1001 in the third embodiment as well. The control circuit 132 may subsequently change the gain of an A/D converter 131 based on the estimated internal temperature. Furthermore, the signal processing circuit 150 may output the estimated internal temperature to an external device 190 through an output circuit 160.

Modification

In the above-described embodiment, the photoelectric conversion device 100 includes one A/D converter 131 for each pixel column. Alternatively, the photoelectric conversion device 100 may include the A/D converter 131 in common with respect to a plurality of pixel columns. The capacity of a floating diffusion 206 may also be switchable. The floating diffusion 206 may be shared among a plurality of photoelectric conversion elements. A plurality of photoelectric conversion elements may be formed under a single microlens so as to be able to detect a phase difference. A plurality of signal lines 113 may be arranged for a single pixel column, and a plurality of selection transistors may be arranged in such case. A comparator 503 may be formed to include a switch and a capacitor for auto-zeroing. The photoelectric conversion device 100 may be formed by a single substrate, formed by two substrates which are stacked and joined to each other, or formed by three or more substrates which are stacked and joined to each other.

An example of an arrangement in which the photoelectric conversion device 100 is formed by two substrates 1101 and 1102 which are stacked and joined to each other will be described with reference to FIG. 11. The pixel unit 110 and a vertical scanning circuit 170 are arranged on the substrate 1101. A readout unit 120, the A/D conversion unit 130, a horizontal scanning circuit 140, the signal processing circuit 150, the output circuit 160, and a timing control circuit 180 are arranged on the substrate 1102. Alternatively, some of the components may be arranged on another substrate. For example, the vertical scanning circuit 170 may be arranged on the substrate 1102 instead of the substrate 1101. The temperature detection circuit 133 described above may be arranged on the substrate 1102. Alternatively, only a resistive element 605 of the temperature detection circuit 133 may be arranged on the substrate 1101, and the remaining components may be arranged on the substrate 1102. Furthermore, the entire temperature detection circuit 133 may be arranged on the substrate 1101.

Figure 11:
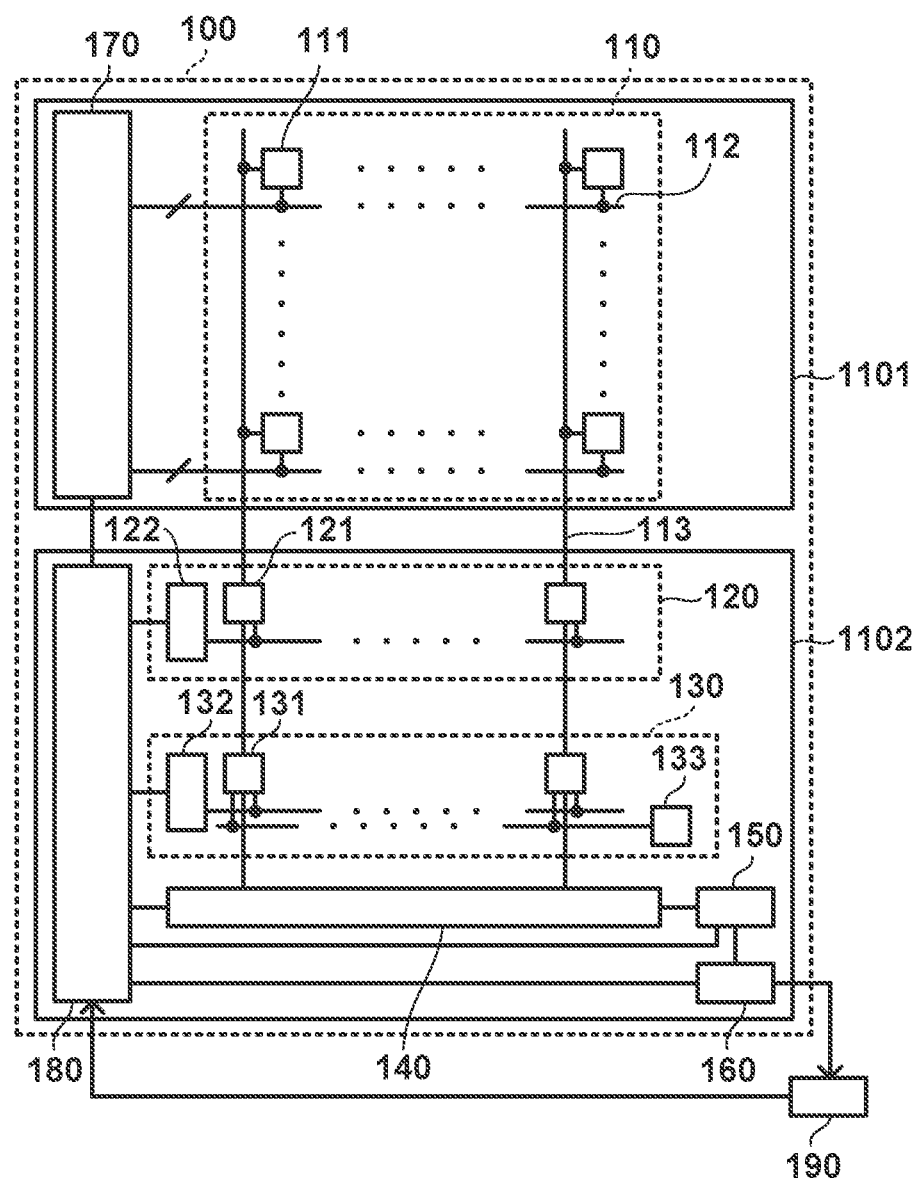
FIG. 11 is a block diagram for explaining an example of the arrangement of a photoelectric conversion device according to a modification.

Although the modification of FIG. 11 was described based on the photoelectric conversion device 100 according to the first embodiment, the photoelectric conversion devices 800 and 1000 according to the other embodiments may also be modified in a similar manner. In such a case, a temperature detection circuit 801 may be entirely arranged on the substrate 1101 or the temperature detection circuit 801 may be entirely arranged on the substrate 1102. Furthermore, the components of the temperature detection circuit 801 may be arranged divided between the substrate 1101 and the substrate 1102.

Other Embodiments

Figure 12A:
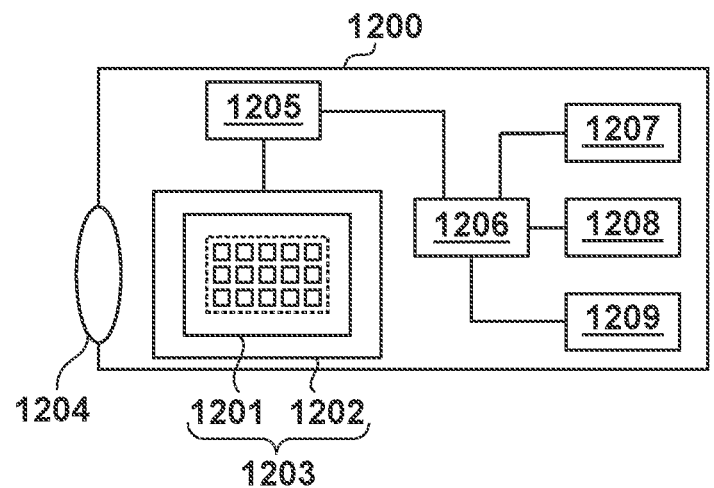
FIGS. 12A to 12C are views for explaining an example of the arrangement of an equipment according to another embodiment.

An embodiment of an equipment 1200 including a semiconductor device 1203 will be described in detail with reference to FIG. 12A. The semiconductor device 1203 may be a photoelectric conversion device according to any one of the above-described embodiments. The semiconductor device 1203 may include a semiconductor device 1201 and a package 1202 accommodating the semiconductor device 1201. The package 1202 may include a base on which the semiconductor device 1201 is fixed and a cover made of glass or the like facing the semiconductor device 1201. The package 1202 may further include a bonding member such as a bonding wire and bump for connecting a terminal of the base and a terminal (bonding pad) of the semiconductor device 1201.

The equipment 1200 may include at least one of an optical device 1204, a control device 1205, a processing device 1206, a display device 1207, a storage device 1208, or a mechanical device 1209. The optical device 1204 is implemented by, for example, a lens, a shutter, and a mirror. The optical device 1204 corresponds to a photoelectric conversion device. The control device 1205 controls the semiconductor device 1203. The control device 1205 is, for example, a semiconductor device such as a Field Programmable Gate Array (FPGA) or an Application Specific Integrated Circuit (ASIC).

The processing device 1206 processes a signal output from the semiconductor device 1203. The processing device 1206 is a semiconductor device such as a Central Processing Unit (CPU) or an ASIC for forming an Analog Front End (AFE) or a Digital Front End (DFE). The display device 1207 is an Electro-Luminescence (EL) display device or a liquid crystal display device that displays information (image) obtained by the semiconductor device 1203. The storage device 1208 is a magnetic device or a semiconductor device that stores the information (image) obtained by the semiconductor device 1203. The storage device 1208 is a volatile memory such as a Static Random Access Memory (SRAM) or a Dynamic Random Access Memory (DRAM) or a nonvolatile memory such as a flash memory or a hard disk drive.

The mechanical device 1209 includes a moving or propulsion unit such as a motor or an engine. In the equipment 1200, the signal output from the semiconductor device 1203 is displayed on the display device 1207 and is transmitted to an external device by a communication device (not shown) included in the equipment 1200. Hence, the equipment 1200 may further include the storage device 1208 and the processing device 1206 in addition to the memory circuits and arithmetic circuits included in the semiconductor device 1203. The mechanical device 1209 may be controlled based on the signal output from the semiconductor device 1203.

In addition, the equipment 1200 is suitable for an electronic equipment such as an information terminal (for example, a smartphone or a wearable terminal) which has a shooting function or a camera (for example, an interchangeable lens camera, a compact camera, a video camera, or a monitoring camera). The mechanical device 1209 in the camera may drive the components of the optical device 1204 in order to perform zooming, an in-focus operation, and a shutter operation. Alternatively, the mechanical device 1209 in the camera may move the semiconductor device 1203 in order to perform an anti-vibration operation.

Furthermore, the equipment 1200 can be a transportation equipment such as a vehicle, a ship, or an airplane. The mechanical device 1209 in a transportation equipment can be used as a moving device. The equipment 1200 as a transportation equipment may be used as a device that transports the semiconductor device 1203 or a device that uses an image capturing function to assist and/or automate driving (steering). The processing device 1206 for assisting and/or automating driving (steering) may perform, based on the information obtained by the semiconductor device 1203, processing for operating the mechanical device 1209 as a moving device. Alternatively, the equipment 1200 may be a medical equipment such as an endoscope, a measurement equipment such as an analysis distance measurement sensor, an analysis equipment such as an electron microscope, or an office equipment such as a copy machine.

Figure 12B:
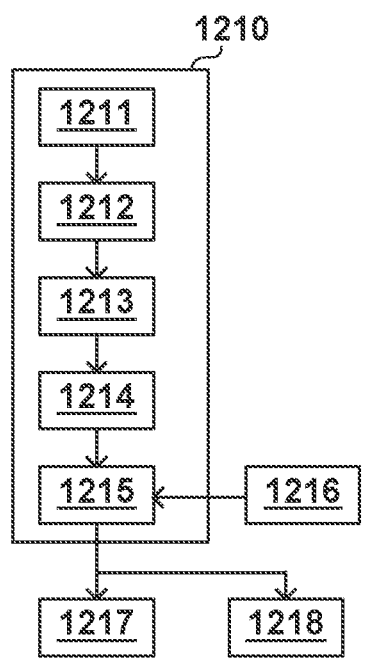
Figure 12C:
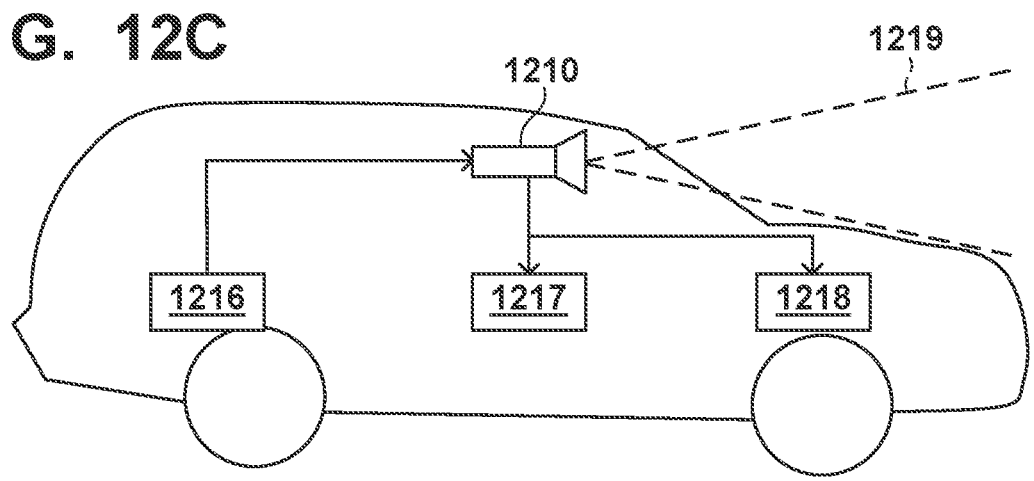

An embodiment of an image capturing system and a moving body will be described with reference to FIGS. 12B and 12C. FIG. 12B shows an example of an image capturing system 1210 concerning an in-vehicle camera. The image capturing system 1210 includes a photoelectric conversion device 1211. The photoelectric conversion device 1211 may be any one of the photoelectric conversion devices described in the above embodiments. The image capturing system 1210 includes an image processing unit 1212 as a processing device that performs image processing for a plurality of image data acquired by the photoelectric conversion device 1211. The image capturing system 1210 also includes a parallax acquisition unit 1213 as a processing device that calculates a parallax (the phase difference of a parallax image) from the plurality of image data acquired by the photoelectric conversion device 1211. In addition, the image capturing system 1210 includes a distance acquisition unit 1214 as a processing device that calculates the distance to a target object based on the calculated parallax, and a collision determination unit 1215 as a processing device that determines, based on the calculated distance, whether there is a possibility of a collision. In this example, the parallax acquisition unit 1213 and the distance acquisition unit 1214 are examples of an information acquisition unit that acquires information such as distance information to a target object. That is, the distance information is information about a parallax, a defocus amount, a distance to a target object, and the like. The collision determination unit 1215 may determine the possibility of a collision by using one of these pieces of distance information. Each of the above-described various kinds of processing devices may be implemented by specially designed hardware or by general-purpose hardware for performing arithmetic processing based on a software module. Alternatively, each processing device may be implemented by an FPGA, an ASIC, or the like or by a combination thereof.

The image capturing system 1210 is connected to a vehicle information acquisition device 1216, and can acquire vehicle information such as a vehicle speed, a yaw rate, and a steering angle. The image capturing system 1210 is connected to a control ECU 1217 as a control device that outputs a control signal to generate a braking force to the vehicle based on the determination result of the collision determination unit 1215. That is, the control ECU 1217 is an example of a moving body control unit that controls a moving body based on distance information. The image capturing system 1210 is also connected to a warning device 1218 that generates a warning to the driver based on the determination result of the collision determination unit 1215. For example, if the collision determination unit 1215 determines as the determination result that the possibility of a collision is high, the control ECU 1217 performs vehicle control to avoid a collision or reduce damage by, for example, applying the brake, returning the accelerator, or suppressing the engine output. The warning device 1218 warns the user by, for example, generating an alarm sound or the like, displaying warning information on the screen of a car navigation system or the like, or vibrating a seat belt or steering wheel.

In this embodiment, the image capturing system 1210 captures the periphery, for example, the front or rear of the vehicle. FIG. 12C shows the image capturing system 1210 in a case in which the front of the vehicle (image capturing range 1219) is captured. The vehicle information acquisition device 1216 sends an instruction to operate the image capturing system 1210 and execute image capturing.

An example in which control is performed not to cause a collision against another vehicle has been described above. However, the image capturing system can also be applied to control for performing automated driving to follow another vehicle or control for performing automated driving to prevent the vehicle from drifting outside a lane. Furthermore, the image capturing system can be applied not only to a vehicle such as an automobile but also to, for example, a moving body (transportation equipment) such as a ship, an airplane, or an industrial robot. The moving device in the moving body (transportation equipment) includes various kinds of moving units such as an engine, motor, wheels, and propellers. In addition, the image capturing system can be applied not only to the moving body but also to an equipment that widely uses object recognition, such as Intelligent Transportation System (ITS).

The above-described embodiments can be changed appropriately without departing from the technical concept. Note that contents disclosed in this specification include not only contents described in this specification but also all items that can be grasped from this specification and its accompanying drawings. The contents disclosed in this specification include a complementary set of concepts described in this specification. That is, if, for example, "A is larger than B" is described in this specification, this specification is considered to disclose "A is not larger than B" even if a description of "A is not larger than B" is omitted. This is because if "A is larger than B" is described, it is assumed that a case in which "A is not larger than B" has been considered.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-045157, filed Mar. 18, 2021, which is hereby incorporated by reference herein in its entirety.

What is claimed is:

1. A photoelectric conversion device comprising:
a light receiving circuit configured to convert light into an electrical signal;
a first hold circuit configured to hold a data signal which represents the electrical signal converted from the light;
a second hold circuit configured to hold a noise signal read out from the light receiving circuit in a reset state;
a first resistive element to which a voltage corresponding to a difference between the data signal held by the first hold circuit and the noise signal held by the second hold circuit is applied;
an analog-to-digital (A/D) converter configured to convert an analog current flowing in the first resistive element into digital data;
a second resistive element; and
a temperature detection circuit configured to generate, based on a current flowing in the second resistive element, an analog output corresponding to an internal temperature of the photoelectric conversion device.

2. The device according to claim 1, wherein the A/D converter is a $\Delta\Sigma$ A/D converter, and
the analog output generated by the temperature detection circuit changes a gain of the $\Delta\Sigma$ A/D converter.

3. The device according to claim 2, wherein the analog current flowing in the first resistive element is a first analog current,
the $\Delta\Sigma$ A/D converter comprises:
a subtractor to which the first analog current is supplied;
an integrator configured to integrate an output from the subtractor;
a quantizer configured to quantize an integration result obtained by the integrator;
a decimation filter configured to perform decimation processing on an output from the quantizer; and
a digital-to-analog (D/A) converter configured to supply a second analog current corresponding to the output from the quantizer to the subtractor, wherein the second analog current is subtracted from the first analog current,
the D/A converter comprises a current generation circuit configured to generate the second analog current, and
a value of the second analog current generated by the current generation circuit with respect to the same output from the quantizer changes based on the analog output generated by the temperature detection circuit.

4. The device according to claim 1, wherein the first resistive element and the second resistive element are made of the same material.

5. The device according to claim 1, wherein the first resistive element and the second resistive element are formed on the same substrate.

6. An equipment comprising:
a photoelectric conversion device defined in claim 1; and
at least one of an optical device corresponding to the photoelectric conversion device;
a control device configured to control the photoelectric conversion device;
a processing device configured to process a signal output from the photoelectric conversion device;
a display device configured to display information acquired by the photoelectric conversion device;
a storage device configured to store the information acquired by the photoelectric conversion device; or
a mechanical device configured to operate based on the information obtained by the photoelectric conversion device.

7. A photoelectric conversion device comprising:
a light receiving circuit configured to convert light into an electrical signal;
a first hold circuit configured to hold a data signal which represents the electrical signal converted from the light;
a second hold circuit configured to hold a noise signal read out from the light receiving circuit in a reset state;
a resistive element to which a voltage corresponding to a difference between the data signal held by the first hold circuit and the noise signal held by the second hold circuit is applied;
an A/D converter configured to convert an analog current flowing in the resistive element into digital data;
a temperature detection circuit configured to generate an analog output corresponding to an internal temperature of the photoelectric conversion device; and
a processing circuit configured to estimate, based on the analog output, an internal temperature of the photoelectric conversion device.

8. The device according to claim 7, wherein the processing circuit changes a gain of the A/D converter based on the estimated internal temperature.

9. The device according to claim 7, wherein the processing circuit corrects the digital data based on the estimated internal temperature.

10. The device according to claim 7, wherein the processing circuit outputs the estimated internal temperature to an external device.

11. The device according to claim 7, wherein the photoelectric conversion device comprises an A/D converter configured to generate digital data from the analog output generated by the temperature detection circuit, and
the processing circuit estimates the internal temperature of the photoelectric conversion device based on the digital data corresponding to the analog output.

12. The device according to claim 7, wherein the resistive element is a first resistive element,
the photoelectric conversion device further comprises a second resistive element, and
the temperature detection circuit generates the analog output based on a current flowing in the second resistive element.

13. The device according to claim 7, wherein the temperature detection circuit includes an optical black pixel circuit, and
the analog output generated by the temperature detection circuit is based on an output from the optical black pixel circuit.

14. An equipment comprising:
a photoelectric conversion device defined in claim 7; and
at least one of
an optical device corresponding to the photoelectric conversion device;
a control device configured to control the photoelectric conversion device;
a processing device configured to process a signal output from the photoelectric conversion device;
a display device configured to display information acquired by the photoelectric conversion device;
a storage device configured to store the information acquired by the photoelectric conversion device; or
a mechanical device configured to operate based on the information obtained by the photoelectric conversion device.

15. A substrate to be stacked on a substrate on which a light receiving circuit configured to convert light into an electrical signal is arranged, comprising:
a first hold circuit configured to hold a data signal which represents the electrical signal converted from the light;
a second hold circuit configured to hold a noise signal read out from the light receiving circuit in a reset state;
a first resistive element to which a voltage corresponding to a difference between the data signal held by the first hold circuit and the noise signal held by the second hold circuit is applied;
an A/D converter configured to convert an analog current flowing in the first resistive element into digital data;
a second resistive element; and
a temperature detection circuit configured to generate, based on a current flowing in the second resistive element, an analog output corresponding to an internal temperature of a photoelectric conversion device.

16. A substrate to be stacked on a substrate on which a light receiving circuit configured to convert light into an electrical signal is arranged, comprising:
a first hold circuit configured to hold a data signal which represents the electrical signal converted from the light;
a second hold circuit configured to hold a noise signal read out from the light receiving circuit in a reset state;
a resistive element to which a voltage corresponding to a difference between the data signal held by the first hold circuit and the noise signal held by the second hold circuit is applied;
an A/D converter configured to convert an analog current flowing in the resistive element into digital data;
a temperature detection circuit configured to generate an analog output corresponding to an internal temperature of a photoelectric conversion device; and
a processing circuit configured to estimate, based on the analog output, the internal temperature of the photoelectric conversion device.

* * * * *